United States Patent
Wortham et al.

(10) Patent No.: US 8,203,305 B1
(45) Date of Patent: Jun. 19, 2012

(54) ENHANCED VOLTAGE-BASED FUEL GAUGES AND METHODS

(75) Inventors: Jason Allen Wortham, Sunnyvale, CA (US); Parviz Ghaseminejad, Mountain House, CA (US)

(73) Assignee: Maxim Integrated Products, Inc., Sunnyvale, CA (US)

(*) Notice: Subject to any disclaimer, the term of this patent is extended or adjusted under 35 U.S.C. 154(b) by 767 days.

(21) Appl. No.: 12/166,584

(22) Filed: Jul. 2, 2008

(51) Int. Cl.
*H02J 7/00* (2006.01)
*H01M 2/10* (2006.01)
*H01Q 11/12* (2006.01)

(52) U.S. Cl. ........ 320/110; 320/106; 320/113; 320/125; 320/132; 429/99; 429/100; 455/127.1

(58) Field of Classification Search .................. 320/110
See application file for complete search history.

(56) References Cited

U.S. PATENT DOCUMENTS

| | | | |
|---|---|---|---|
| 4,390,841 A | 6/1983 | Martin | |
| 6,166,524 A * | 12/2000 | Takeuchi et al. | 320/132 |
| 6,307,379 B2 * | 10/2001 | Podrazhansky et al. | 324/432 |
| 6,329,822 B1 | 12/2001 | Powers | |
| 6,366,054 B1 * | 4/2002 | Hoenig et al. | 320/132 |
| 6,549,014 B1 | 4/2003 | Kutkut et al. | |
| 6,789,026 B2 * | 9/2004 | Barsoukov et al. | 702/63 |
| 7,076,375 B2 * | 7/2006 | Raichle et al. | 702/63 |
| 2002/0130637 A1 | 9/2002 | Schoch | |
| 2004/0257087 A1 * | 12/2004 | Murakami | 324/426 |
| 2005/0057255 A1 | 3/2005 | Tate et al. | |

FOREIGN PATENT DOCUMENTS

EP 0471698 9/1993

OTHER PUBLICATIONS

"Characteristics of Rechargeable Batteries", National Semiconductor, (undated), 10 pgs total.
"Choosing a Rechargeable Battery", *Electus Distribution, Reference Data Sheet: RECHARGE.PDF* (1), (2001), 4 pgs total.
"Low-Cost I²C Battery Monitor", *Dallas Semiconductor, DS2745 Data Sheet*, (Sep. 14, 2005), pp. 1-14.
"Performance Characteristics", *MPower Solutions*, (2005), 10 pgs total.
"SBS 1.1-Compliant Gas Gauge Enabled with Impedance Track (TM) Technology for Use with the bq29312A", *Texas Instruments, bq20z80-V101 Data Sheet*, (Sep. 2004), 73 pgs total.
"Stand-Alone Fuel Gauge Ic", *Dallas Semiconductor, DS2780 Data Sheet*, (Dec. 9, 2004), pp. 1-27.
"Stand-Alone Fuel Gauge IC", *Dallas Semiconductor, DS2782 Data Sheet*, (Apr. 25, 2005), pp. 1-25.
Rong, Peng, et al., "An Analytical Model for Predicting the Remaining Battery Capacity of Lithium-Ion Batteries" *IEEE Transactions on Very Large Scale Integration VLSI Systems*, vol. 14, No. 5, (May 2006), pp. 1-12.
"Notice of Allowance Dated Mar. 1, 2012, U.S. Appl. No. 11/876,531".

* cited by examiner

*Primary Examiner* — Yalkew Fantu
(74) *Attorney, Agent, or Firm* — Blakely Sokoloff Taylor & Zafman LLP

(57) ABSTRACT

Enhanced voltage-based fuel gauges and methods that increase the accuracy of voltage-based fuel gauges and allow the use of voltage-based fuel gauges to detect current, and particularly excessive current from a battery without the use of a sense resistor. When used with a coulomb counter, the outputs of a voltage-based fuel gauge and a coulomb counter may be combined in a manner that allows the combination to provide better performance that either alone may provide. Various embodiments and methods of operation are disclosed.

34 Claims, 7 Drawing Sheets

ENHANCED VOLTAGE-BASED FUEL GAUGES AND METHODS

BACKGROUND OF THE INVENTION

1. Field of the Invention

The present invention relates to battery fuel gauges for indicating the state of charge or discharge, typically of a rechargeable battery.

2. Prior Art

As used herein, the word battery will be used generally, and is to be understood to include multiple batteries and battery packs, that is, multiple batteries packaged and electrically connected to functionally appear as a single battery of a higher voltage and/or higher current capacity.

In many rechargeable battery powered devices, it is desirable to know the state of charge (or discharge) of the battery during its discharge cycle so that the user of the battery powered device can appropriately time the recharging of the battery, and when necessary, limit the use of the battery powered device to more essential uses to preserve power before the next recharging of the battery. One way this is done in the prior art is to use battery fuel gauges, generally referred to as coulomb counters, which monitor the current provided to and taken from the battery, which for a battery of a given amp-hour rating, can be used to predict what fraction of the amp-hour rating remains in the battery throughout its discharge cycle. Such devices are readily commercially available, such as by way of example, the DS2745, the DS2782 and DS2780 fuel gauges manufactured and sold by Maxim Integrated Products of Sunnyvale, Calif., assignee of the present invention.

Such devices are useful for the intended purpose, though have certain characteristics that are less than ideal. By way of example, since such devices monitor current to and from the battery, a current sensor is required, normally in the form of a current sense resistor in series with the battery, so that the voltage drop across the resistor, positive or negative, can be monitored. Since battery fuel gauges typically are designed to operate on relatively low sense voltages, the voltage drop across the current sense resistor in series with the battery need not be large, though still that voltage drop represents a loss of battery voltage and power available to the circuitry powered by the battery, as well as power dissipation (heating) in the resistor itself. Normally, such resistors are discrete components, a disadvantage itself, particularly in battery powered devices such as laptop computers and cell phones where circuit area and cost are to be held to a minimum.

Another undesirable characteristic of such battery fuel gauges is the fact that they essentially operate as integrators, and as such, their output at any time is subject to an accumulation of integration errors since the last time they were set to a reference. Accordingly, such battery fuel gauges work satisfactorily when a battery is regularly fully charged, or alternatively, fully discharged, to provide the reference, but do not perform well if the battery is repeatedly only partially charged and partially discharged. Additionally, a coulomb-counter fuel-gauge can perform no better than its periodic voltage-based corrections, which often occur near full or empty.

Another approach to obtaining an indication of the state of charge of rechargeable batteries is to simply monitor the terminal voltage of the battery and to provide a warning to the user when the terminal voltage begins to approach the voltage at which the battery powered device will automatically shut down. This, of course, has the advantage of simplicity and avoidance of the requirement of a current sense resistor in series with the battery, though has the disadvantage of not providing an ongoing indication of the state of charge of the battery because of not considering the load on the battery at the time of the indication. In that regard, many battery operated devices do not have a constant load, but rather a variable load, depending on what capabilities of the battery powered device are in use at the particular time. By way of example, in cell phones, the battery power required for transmitting is far greater than the battery power required to listen for a new incoming call. Accordingly, a battery voltage may be adequate to detect an incoming call, though may drop too much when trying to place or respond to a call because of the higher current demand on the battery for such functions.

DETAILED DESCRIPTION OF THE PREFERRED EMBODIMENTS

Certain preferred embodiments of the present invention do not use a current sense resistor, but instead are preferably effectively connected directly across the battery terminals, typically by being connected directly across circuit connections which themselves connect directly to the battery terminals when the battery is in the battery operated device. Such devices shall be referred to herein as voltage-based fuel gauges or voltage-based battery fuel gauges. In other preferred embodiments, a voltage-based fuel gauge and a coulomb counter are combined in a fuel gauge to take advantage of the desirable characteristics of each for improved performance compared to that realizable with either individually. As shall be subsequently discussed, the connection of the battery fuel gauge may be before or after the on/off switch for the device so as to either be constantly powered or powered only when the device itself is powered. In one preferred embodiment, the battery fuel gauge is always powered so long as the battery is in the battery powered device, as the power consumption of the battery fuel gauge is only a small fraction of the battery self discharge rate for the battery.

In essence, the voltage-based battery fuel gauges of the present invention model the battery itself, and as shall be seen, track the state of charge of the battery independent of the current load, if any, on the battery. In particular, an ideal battery of a given amp-hour capacity would provide a constant voltage output until outputting its total amp-hour capacity, after which the battery voltage would fall to zero. Real batteries, however, exhibit a decrease in terminal voltage with a decreasing state of charge. Some batteries have a terminal voltage that falls off rapidly as the fully discharged state is approached. Some types of batteries, when fully charged, have a higher terminal voltage which decreases fairly quickly during an initial discharge, though generally commonly used rechargeable batteries, except for these "end" conditions, have an open terminal voltage versus state of charge that is somewhat linear over most of the battery discharge cycle.

Some preferred embodiments of the present invention are intended for use for monitoring the state of charge of a lithium-ion (Li-Ion) battery. However, it should be understood that the principles of the present invention are readily applicable to other types of rechargeable battery, such as by way of example, a nickel-cadmium (Ni—Cad) battery, a nickel metal-hydride (Ni-MH) battery, a lead-acid battery, and Lithium variants (with Fe, Co, or Mn). Additionally, in applications with multiple chemistries with wide variation, multiple models can be executed simultaneously to diagnose which chemistry is actually installed in the device to thereafter provide an output for that model to accurately monitor the state of charge of the battery.

Figure 1:
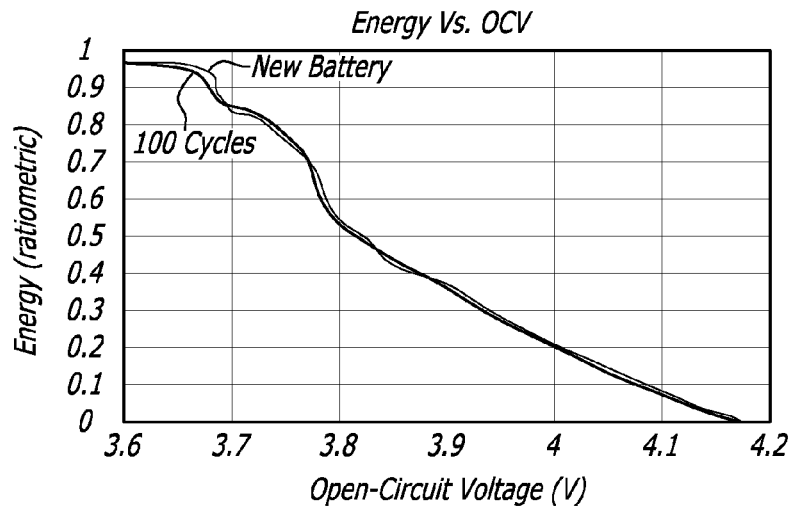
FIG. 1 is a graph showing a typical open circuit voltage versus state of charge for a single cell Li-Ion battery.

FIG. 1 is a graph illustrating the state of charge (SOC) versus open circuit single cell voltage (OCV) for lithium-ion batteries of various manufacturers. These curves actually may be considered to represent the state of discharge of the batteries, as the SOC when fully charged (open circuit voltage approaching 4.2 volts) is shown as zero, and the SOC when considered fully discharged at an open circuit voltage of 3.5 volts is shown as being essentially 1.0. These curves were generated by measuring the terminal voltage when fully charged, then successively discharging each battery by some ampere hour increment, allowing the open circuit battery voltage to stabilize, and then taking another open circuit voltage reading. Doing this for new batteries and aged batteries, and at different temperatures, yields curves of a similar shape. Note that once the open circuit voltage falls much below 3.7 volts, it falls relatively rapidly to 3.5 volts, though the rest of the discharge curve can be roughly approximated by a straight line. Also note that this curve is very different from the commonly-presented battery discharge curves, which show capacity remaining below 3.3V. This is because most widely published data shows the battery voltage under load.

The present invention recognizes that in general, it is the open circuit battery voltage that is a good indicator of the state of charge of the battery, as shown in FIG. 1, which open circuit voltage is generally independent of how the battery reaches a particular open circuit voltage. For instance, referring to FIG. 1, after stabilizing, the open circuit battery voltage after drawing current at some current level from a battery for some percentage of the battery capacity in amp-hours will be the same as the open circuit battery voltage for that battery after drawing current from the battery at one half that rate for twice as long (i.e., the same amp-hours of discharge). Also the open circuit voltage is a good indication of the percentage of discharge (or charge) remaining in the battery, as opposed to amp-hours that may decrease with battery aging.

The present invention takes advantage of those characteristics by modeling a battery so as to effectively track the open circuit battery voltage (cell voltage times the number of cells in series) in spite of any load on the battery. The discharge characteristics of a Li-Ion battery suggest that as a first order of approximation, the battery may be modeled as a capacitor, as the capacitor has the characteristic of a linearly decreasing voltage proportional to the current being drawn from the capacitor. Also the fact that the Li-Ion battery terminal voltage immediately drops by an amount dependent upon the load applied thereto at any state of charge suggests that to a first order approximation, the Li-Ion battery may be approximated by the RC circuit of FIG. 2. The values of R1 and C1 of FIG. 2 do not need to correspond to the corresponding values for the battery, but rather should be selected to have the same time constant, R1C1, as the battery appears to have.

Figure 2:
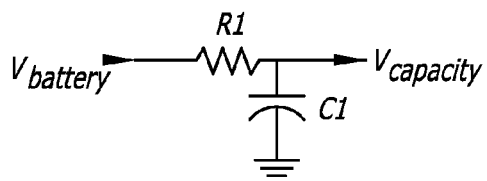
FIG. 2 shows a simple RC circuit that to a first order approximation, approximates the characteristics of a Li-Ion battery.
Figure 3:
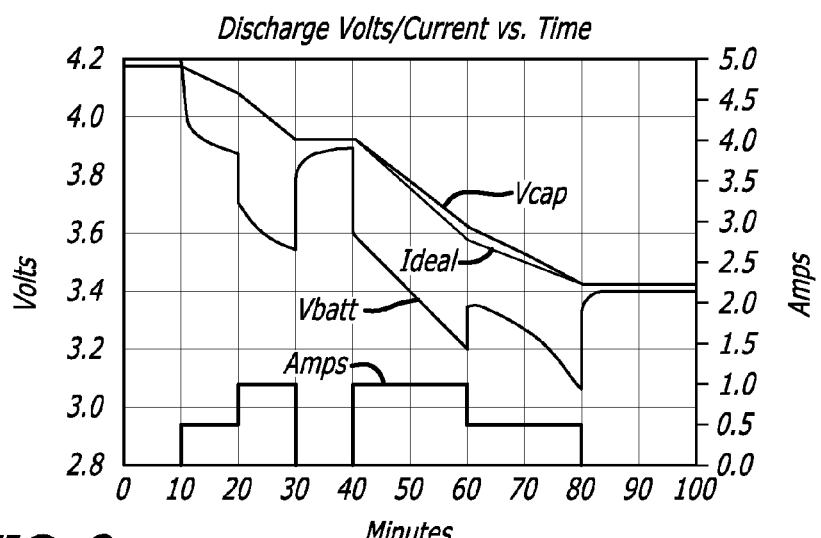
FIG. 3 presents graphs illustrating the effectiveness of the simple battery model of FIG. 2.

For the first example, the values of R and C are assumed to be constant, i.e., the time constant is constant. The effectiveness of this simple battery modeling may be seen in FIG. 3. This Figure shows a Li-Ion battery being discharged with a load current that varies with time. The load current is plotted in the lower portion of the curve as "Amps." The terminal voltage on the battery is labeled "Vbatt." The shape of the curve for the battery terminal voltage Vbatt is clearly dependent not only on the state of charge of the battery, but also on the load current being delivered by the battery. Also note that when the load current is suddenly terminated, the battery voltage does not immediately jump to its long term, no-load voltage, but rather asymptotically approaches its long term, no-load voltage. This sort of recovery, and its time constant, varies with the type of battery involved. The curve labeled "Ideal" is a curve determined by the known characteristics of the Li-Ion battery and the state of charge thereof, as determined by the amp-hours represented by the area under the load current (Amps) curve from a full charge. The curve labeled "Vcap" is the voltage on the capacitor such as C1 of FIG. 2 ($V_{capacity}$), which in the present invention would be used to estimate the state of charge on the battery. Note that even with the simple RC circuit of FIG. 2, the voltage Vcap quite closely tracks the Ideal curve, that is, the no-load or open terminal battery voltage Vbatt, during the discharge of the battery, in spite of a load current and load current changes during the discharge. Thus just using a simple RC circuit as shown in FIG. 2 of a proper RC time constant, the voltage $V_{capacity}$ on capacitor C1 provides a good indicator for the state of charge of the battery, independent of the load current being provided by the battery.

Figure 4:
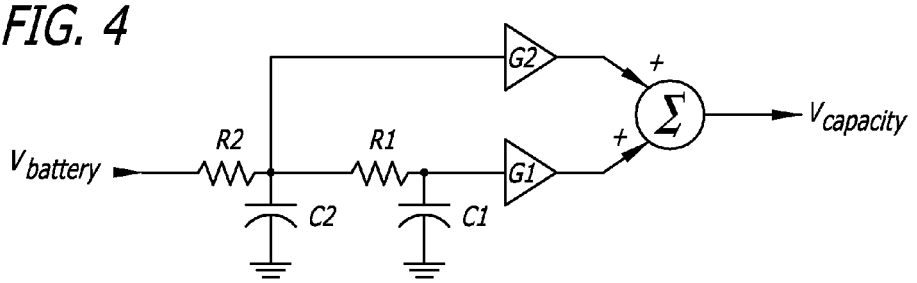
FIG. 4 is an RC circuit battery model that is more complex than that of FIG. 2.

If desired, other more complicated battery model circuits may be used. One such circuit is illustrated in FIG. 4, which uses not only the RC circuit R1C1 of FIG. 2, but an additional RC circuit R2C2. In this particular model, the voltage on each of the capacitors C1 and C2 is amplified with gains of G1 and G2 and summed to provide the voltage $V_{capacity}$. Note that in this circuit, the voltage on capacitor C1 will lag the voltage on capacitor C2. Thus during the normal discharge of the battery while delivering a load current, the voltage on capacitor C1 will be slightly higher than the voltage on capacitor C2, both voltages decreasing during the discharge of the battery. When the load current it taken off the battery, the voltages on the two capacitors will asymptotically equalize, simulating battery open circuit voltage recovery. In other battery models one might choose, not all model nodes may need voltage sensing to satisfactorily model the battery.

Figure 5:
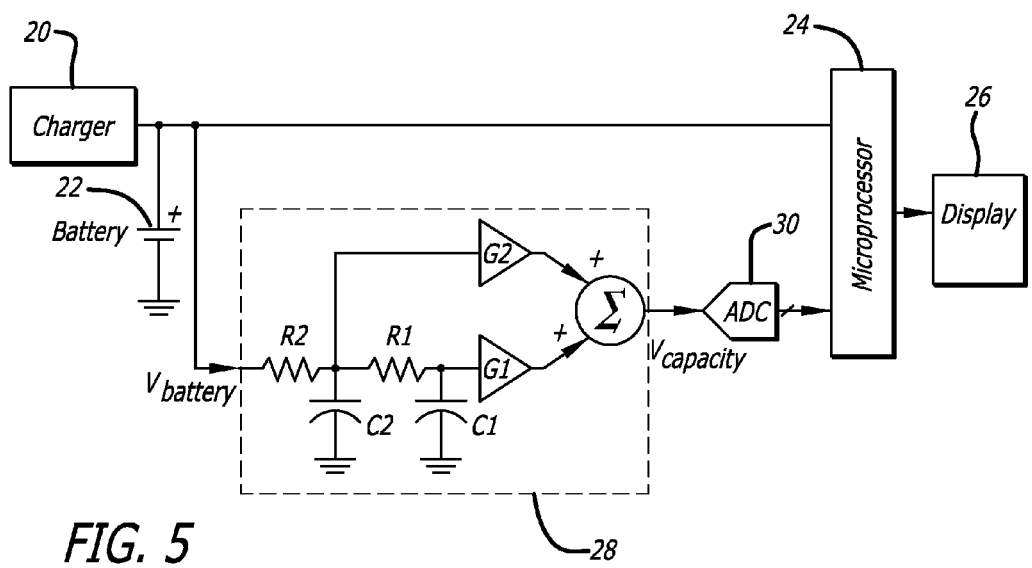
FIG. 5 illustrates an exemplary system using a fuel gauge in accordance with the present invention.

An exemplary system using a fuel gauge in accordance with the present invention is illustrated in FIG. 5. As shown in this Figure, the battery 22 is connected to the charger 20 and to power some device 24, typically but not necessarily a microprocessor based device, which in turn controls a display 26. A fuel gauge 28 in accordance with the present invention is also connected to the battery, with the analog voltage output $V_{capacity}$ being converted to a digital form by analog-to-digital converter 30 and provided to the microprocessor, which in turn displays the state of charge of the battery 22 on display 26, in addition to its normal use of the display.

Figure 6:
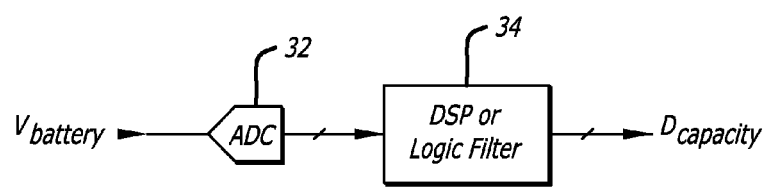
FIG. 6 illustrates a fuel gauge battery model which first converts the battery terminal voltage $V_{battery}$ to digital form.
Figure 7:
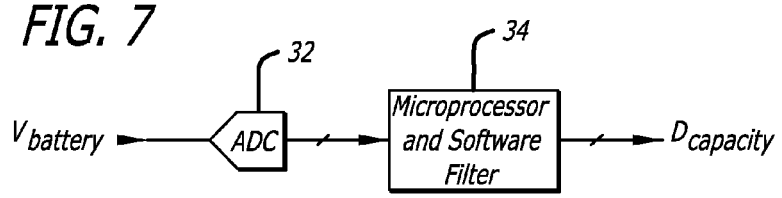
FIG. 7 illustrates a variation on the fuel gauge battery model of FIG. 6.

Referring again to FIG. 3, it may be seen that when this battery is delivering 1 amp for the 20 minutes between the 40 minute and 60 minute points of the graph, the Ideal voltage only drops approximately three-tenths of a volt. Thus an RC circuit, such as for the simple RC circuit model of FIG. 2, would have to have a very long time constant, requiring a very large capacitor even when using a relatively large resistor. While the model may be achievable by using, by way of example, a super capacitor, other techniques may readily be used also. By way of example, FIG. 6 illustrates a fuel gauge battery model which first converts the battery terminal voltage $V_{battery}$ to digital form in analog-to-digital converter 32, that is then used in a digital signal processor or logic filter 34 to output a digital signal D capacity equivalent to the analog voltage $V_{capacity}$ output by analog battery models such as hereinbefore described with respect to FIGS. 2, 4 and 5. FIG. 7 is similar to FIG. 6, although the conversion of the battery voltage in digital form to the digital signal indicating battery capacity is done using a microprocessor and software filter 34. In that regard, note that the exemplary battery models of FIGS. 2 and 4 are simple filter circuits, providing as an output the accumulated effects of past history. Accordingly, whatever battery model is used is easily implemented or simulated in either a DSP or logic filter 34 or by a microprocessor 34 operating under software control. In that regard, as used herein, software includes firmware.

Figure 8:
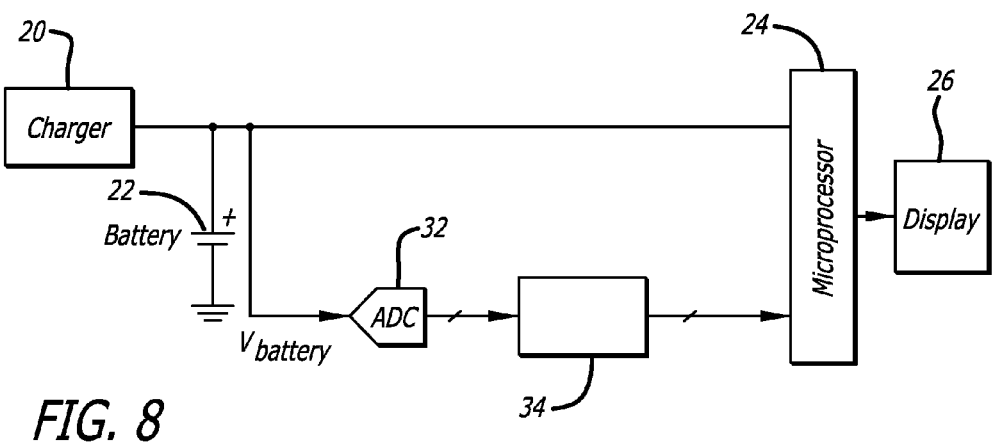
FIGS. 8 through 10 illustrate various ways of implementing the battery model fuel gauges of the present invention into devices powered by the battery. Such Fuel gauges preferably are digital, though analog implementations may be used.
Figure 9:
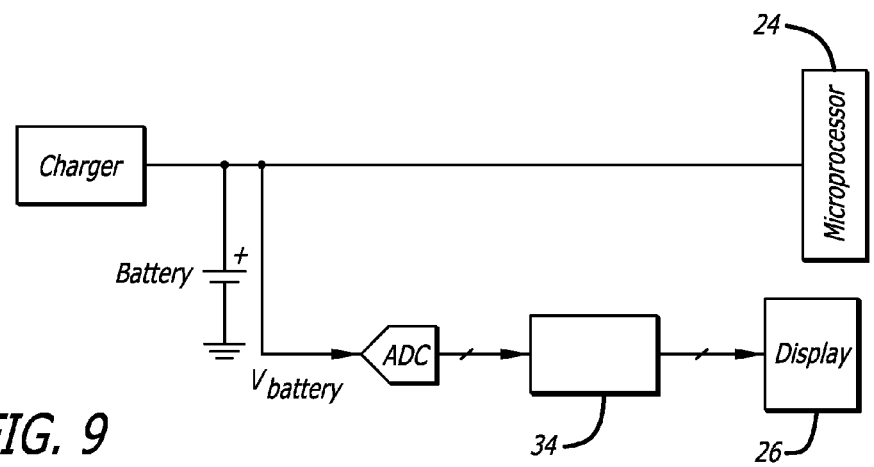
Figure 10:
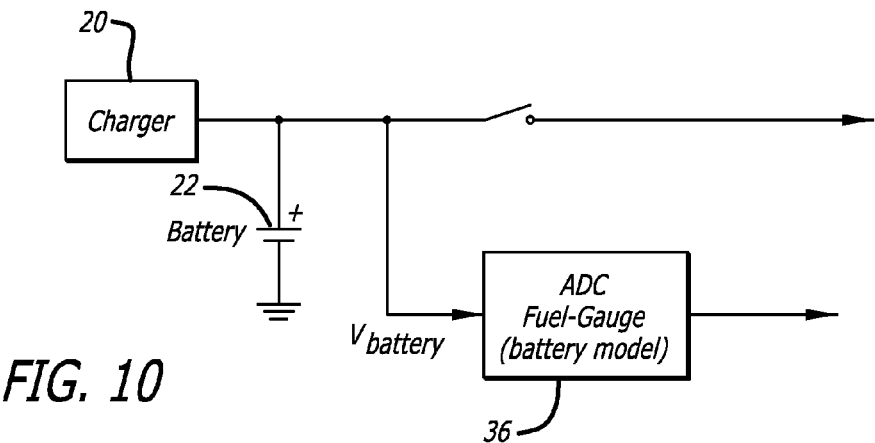

Digital implementations such as that shown in FIGS. 6 and 7 have certain advantages over analog implementations, even if the required time constants could be achieved. In particular, a digital implementation may include additional support circuitry for various related functions. By way of example, in a system using a digital fuel gauge battery model such as shown in FIG. 8, the additional "circuitry" in hardware or software may, by way of example, remove a DC level corresponding to what would be considered a fully discharged condition, so that the digital signal output to the device 24 may display that signal, essentially directly without further processing. In another embodiment shown in FIG. 9, the digital fuel gauge battery model 34 may include circuitry to directly drive the display 26, or at least provide signals to the display to operate that portion of the display in addition to signals provided to the display by the device 24. Another function likely to be integrated into the digital fuel gauge battery model 34 is the initiation of the device. In that regard, referring to FIG. 3, the curve for the capacitor voltage Vcap in the model of FIG. 2 usually represents the voltage across the capacitor starting with a full charge on the battery, and more specifically, usually a voltage on the capacitor equal to the starting no load voltage of the battery. Accordingly, some form of initiation of a fuel gauge in accordance with the present invention is preferably used. One way of doing this is by powering the fuel gauge and analog-to-digital converter all the time, as shown in FIG. 10. Here the battery 22 is connected to the charger 20 and the analog-to-digital converter and fuel gauge 36 whenever the battery is in the battery powered device. If the fuel gauge is an analog circuit, the capacitor or capacitors should have low leakage, and therefore, won't cause a meaningful power drain on the battery. If the fuel gauge is a digital fuel gauge, such as by way of example shown in FIGS. 6 and 7, the power consumption of the fuel gauge could be kept very low. By way of example, if the fuel gauge draws an average of 10 microamps, it will draw approximately 100 milliamp hours per year, thus typically drawing much less power than the self discharge rate of typical rechargeable batteries. In that regard, the power required by a digital fuel gauge implementation may be kept very low, as the computations are very simple. Also the circuitry may be kept in a sleep mode most of the time, waking up periodically to update the calculation, such as by way of example, every few milliseconds. Thus for batteries having any substantial capacity, such as in cell phones and laptop computers, a fuel gauge in accordance with the present invention may be connected to be permanently on (perhaps automatically shutting off on a battery voltage lower than the device itself will shut off) so long as the battery is in the device without significant effect on the battery.

Also in the embodiment of FIG. 10, the fuel gauge may sense the removal of the battery, and when a battery is reinserted, can be configured to quickly charge the capacitors to the battery voltage if an analog fuel gauge is used, or to set variables in a digital implementation to correspond to the battery voltage. In that regard, normally the battery powered device is turned off when batteries are changed so there would be no load on the battery when the battery is inserted. Note, however, that if the device happened to be turned on when a fresh battery is inserted, those initial settings would be in error by the voltage drop caused by the load on the battery. However, note that one feature of the present invention is the fact that the error in the initial setting is reduced over time, unlike a coulomb counter, particularly during long off periods such as overnight. Also unlike a coulomb counter using a sense resistor in series with the battery, an embodiment of the present invention like that of FIG. 10 will track the self discharge of the battery to provide accurate readings in spite of self discharge.

It should be noted that in FIG. 1, the curve of state of charge (in normalized ampere-hours) versus open circuit voltage for a battery is in effect a measure of the apparent change in capacitance of the battery model with state of charge. In particular:

$$i = C\, dv/dt$$

$$i\, dt = C\, dv$$

$$\int_{T1}^{T2} i\, dt = \int_{V1}^{V2} C\, dv = i(T_2 - T_1) = C(V_2 - V_1) \text{ or}$$

$$C = \frac{i(T_2 - T_1)}{V_2 - V_1}$$

Thus the apparent capacitance in the simple RC model at any point in the open circuit voltage versus state of charge curves of FIG. 1 is equal to the inverse of the rate of change of the open circuit voltage of the battery per amp-hour of current withdrawn. Consequently one may plot the equivalent capacitance of the battery versus open circuit voltage. Such a plot for a representative battery of FIG. 1 may be seen in FIG. 11. Also shown therein is a piecewise approximation of the apparent capacitance. Actual capacitance values are not given, as they depend on the value of the resistance chosen for the battery model. In that regard, it has been found that the apparent time-constant of such a battery is substantially constant, so that a fixed time-constant may be used in the battery model. (Alternatively, one may also take into consideration the variation of resistance with one or more additional parameters, such as current, temperature or the like.) Preferably each piecewise approximation has an area under the piecewise value equal to the area under the measured curve over that same range of open circuit voltage applicable to the piecewise approximation, or in other words, they each have the same average value.

Figure 11:
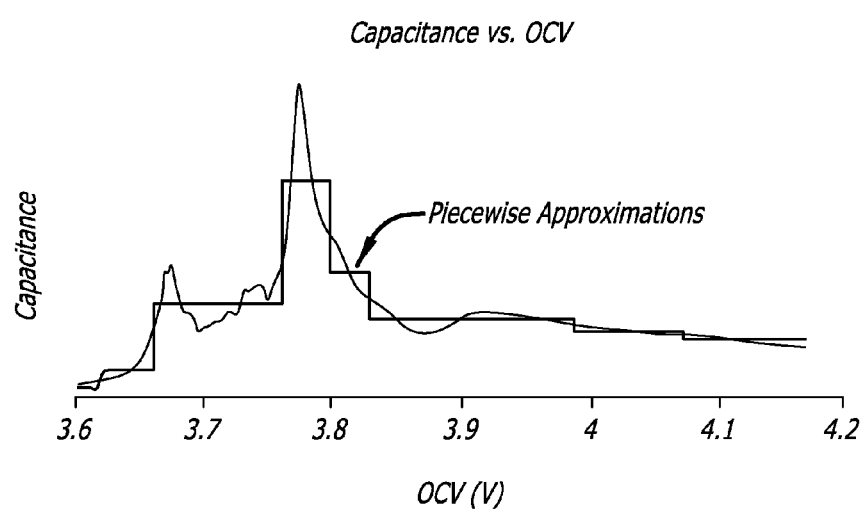
FIG. 11 presents a plot the equivalent capacitance of a Li-ion battery versus open circuit voltage and a piecewise approximation of that capacitance.

Referring to FIG. 11 and the prior equations, it will be noted that the area under the capacitance curve versus open circuit voltage, the integral of C dv over the useful open circuit voltage range of the battery, is the amp-hour capacity of the battery, and thus a direct measure of the state of charge of the battery. Further, using a fixed resistance R in the model, the difference between the measured battery voltage and the open circuit battery voltage is equal to the battery load current times that fixed resistance. Consequently the difference between the open circuit battery voltage and the measured battery voltage is a measure of the load current. Thus FIGS. 1, 3 and 11 in general illustrate the dynamic electrical characteristics of the battery.

Figure 12:
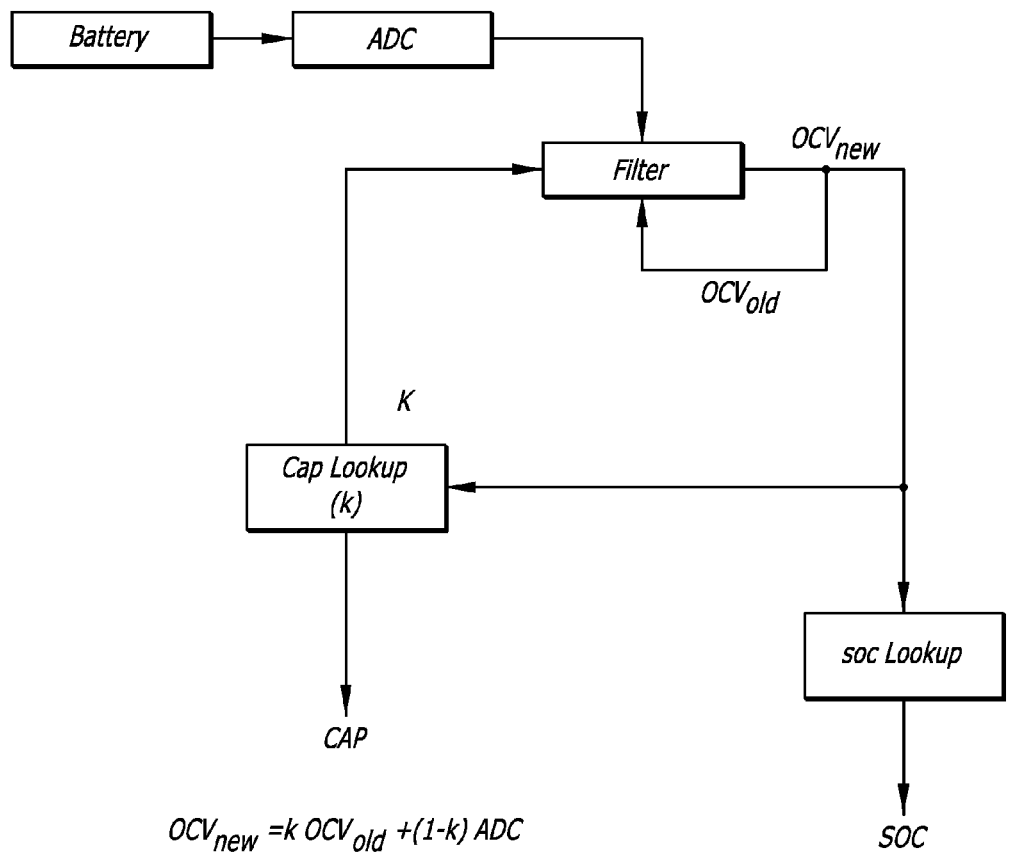
FIG. 12 is a block diagram illustrating a digital integrator implementation for a fuel gauge using the piecewise approximation of the capacitance curves of FIG. 11.

Now referring to FIG. 12, a block diagram illustrating a digital integrator implementation for a fuel gauge using the piecewise approximation of the capacitance curves of FIG. 11 may be seen. The battery terminal voltage is monitored and converted to digital form by the ADC. That value is effectively input into a digital filter, the output of which is the open circuit voltage OCV. The output of the filter is used to look up a parameter that is proportional to the capacitance of the battery at that value of OCV, which then adjusts the time constant of the filter. Thus a new value of OCV is calculated from the prior (old) value using the ADC and Cap lookup table output, the lookup table output effectively giving due regard to the equivalent capacitance of the battery at the respective value of OCV (FIG. 11). Note that the actual state of charge (SOC) of the battery is a function of the OCV, so is also known for an SOC lookup table (or the integral of the capacitance table). The actual implementation used may be varied as desired, and is itself not part of this invention.

As previously mentioned, preferred embodiments are permanently powered whenever the battery is in the battery powered device. This works well for devices like laptop computers which have substantial battery power. In other applications, perhaps for power consumption or other considerations, it may be desired to turn the fuel gauge off when the device is turned off. However, the fuel gauge must be initialized on each turn-on of the device. If the battery powered device immediately draws substantial power, the initiation will be inaccurate, though the accuracy will increase with time, rather than decrease as in a typical coulomb counter. For a cell phone, the power in the ready-to-receive mode is low, so the small inaccuracy in the initiation may be inconsequential. Another approach to initiation, by way of example, is to delay the turn-on of the device for a small fraction of a second, such as a millisecond or less to allow debouncing of the switch and for the fuel gauge to take a battery voltage reading from which it may be initialized before the device load is applied to the battery. Another implementation is to have the main fuel gauge circuitry only powered when the battery operated device is turned on. However a simple circuit such as a simple RC circuit with a time constant of perhaps a second or so may be connected to the battery at all times, and when the battery is replaced, can provide an open circuit battery voltage reference for initializing the fuel gauge. Here again, if the device is turned on when the battery is inserted, there will be an initialization error dependent on the immediate and recent current load on the battery. However note that in this implementation, a battery model fuel gauge may be reinitialized each time the battery operated device is turned on using the voltage stored in the simple RC circuit at the moment of turn-on. Another implementation is to connect a fuel gauge in accordance with the present invention downstream of the on-off switch and directly in line with the power to the battery operated device. Consequently on each application of power to the battery operated device, the fuel gauge may delay the device turn-on for a small fraction of a second to allow the fuel gauge to be initialized with the initial open terminal battery voltage. This allows re-initialization of the fuel gauge on every turn-on, as well as on every battery change, all within the fuel gauge, and always with no load on the battery. This helps facilitate the incorporation of a fuel gauge with re-initiation on each turn-on without general modification of the device being powered, and may be advantageous for applications having low power requirements and thus relatively small batteries.

It should be noted that since the output of the battery fuel gauges of the present invention represent the state of charge as a percentage of the battery capacity, the fuel gauges maintain much better accuracy of the relative state of charge over the useful life of a battery than do coulomb counters. They also track battery performance with temperature quite well, though improved performance might be obtained by measuring battery temperature and varying the battery model parameters accordingly (especially time constant).

In a voltage-based fuel gauge, the current can be approximated by using the model's predicted internal OCV (Open-Circuit-Voltage) and the real external voltage. The difference represents a voltage across the battery's resistance, which can be used to estimate the current. This has some interesting uses. In particular, over-current and short-circuits can be detected without using any current-sense resistor. This current-sense resistor and circuitry can be expensive in high-power applications, like cars and power-tools. Also charge and discharge rate can be approximated for determining time-until-empty or time-until-full.

Figure 13:
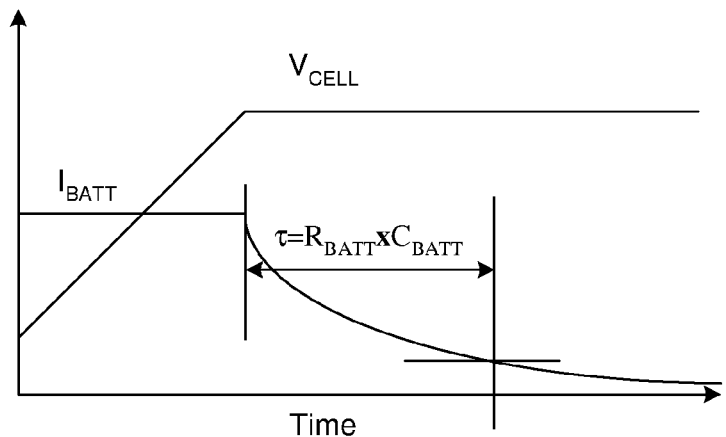
FIG. 13 illustrates how the critical resistance in the long time constant of a battery model can be observed during a routine CV (constant-voltage) portion of the charge cycle.

Any effective voltage-based fuel gauge must consider the battery resistance and capacitance to determine the appropriate filter time constant. A detailed battery model includes several different resistances. Some of the resistors are observable on a short time scale, but the critical resistance which defines the long time constant of a battery model requires >20 minutes to accurately observe. Simple brief load pulses do not reveal this resistor. Also, this resistance cannot be adequately measured by observing the relaxation time-constant of the battery. However, whether for a single pole battery model or a multiple pole battery model, this resistance can be observed during a routine CV (constant-voltage) portion of the charge cycle, as shown in FIG. 13. In this Figure, $V_{CELL}$ is the terminal voltage on the cell, $R_{BATT}$ is the resistance to be determined, $C_{BATT}$ is the capacitance as per the battery model, and $I_{BATT}$ is the charging current into the battery. Thus the time constant in CV mode defines the battery resistance and capacitance. Because aging effects resistance, the effect of aging can be calibrated out of a voltage-based fuel gauge system by observing the time constant in CV mode. Also, any additional resistance (Rsense, MOSFETs, trace resistance, etc) considered as forming the battery circuit can be calibrated by observing this time constant. In determining the resistance, the capacitance for that state of charge should be used.

With respect to the required computations, an abbreviated method may be used to simulate any RC network without requiring digital multiply, and using only a minimum of digital silicon. In practice, this means a small digital state machine can implement a full 2 pole model which more accurately represents a battery.

Figure 14:
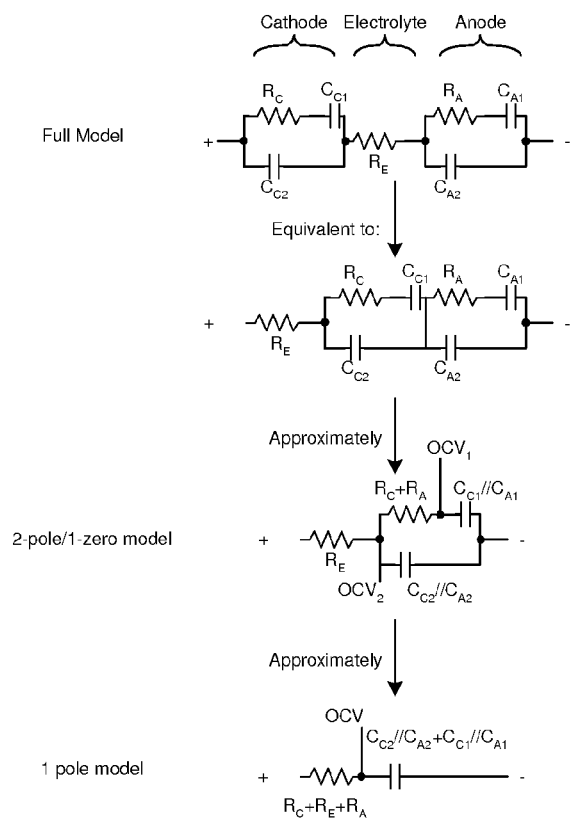
FIG. 14 presents various battery model images.

Now referring to FIG. 14, various model images for a battery may be seen. In this Figure, A//B is defined as A*B/(A+B). These model images themselves are not fully descriptive of the battery. Any useful implementation of the model must consider that the capacitances are strongly dependent on the SOC, and the resistances are dependent on temperature and age.

In practice, an accurate voltage-based fuel gauge can be created using only the 1-pole model, as long as the capacitance is treated dynamically. The one-pole model such as shown in FIG. 14 neglects the battery's normal relaxation behavior after the removal of a load. For optimal accuracy the 2-pole model should be used.

A one pole system has the following behavior:

$$OCV_{n+1} = OCV_n \cdot e^{-t_{calc}/\tau} + V_{CELL} \cdot (1 - e^{-t/\tau})$$

This equation is a more general form of that shown in FIG. 12. Relating the above equation to that of FIG. 12: $OCV_{n+1} = OCV_{new}$, $CV_n = OCV_{old}$, $e^{-t_{calc}/\tau} = k$, $V_{CELL} = ADC$ and $(1 - e^{-t/\tau}) = 1 - k$.

However, to minimize the processing, multiply and exponentials should be avoided. A simpler implementation based is:

$$OCV_{n+1} = OCV_n \cdot \left(1 - \frac{1}{2^{shift}}\right) + V_{CELL} \cdot \frac{1}{2^{shift}}, \text{ or}$$

$$OCV_{n+1} = OCV_n + (V_{CELL} - OCV_n) \cdot \frac{1}{2^{shift}}$$

This simplifies to:

$$OCV_{n+1} = OCV_n + (V_{CELL} - OCV_n) >> \text{shift}$$

where shift is simply a digital shift.

So this implementation behaves as a 1 pole system, and uses only shift, subtract, and add. Note that in this implementation, the time-constant is a function of the shift, according to the following equation:

$$e^{-t_{calc}/\tau} = \left(1 - \frac{1}{2^{shift}}\right), \text{ so } \tau = \frac{-t_{calc}}{\ln\left(1 - \frac{1}{2^{shift}}\right)} \text{ or } t_{calc} = -\tau \ln\left(1 - \frac{1}{2^{shift}}\right)$$

Where $t_{calc}$ is the time between calculations, and shift is the bit shift used in the above equation.

$$\left(\frac{1}{2^{shift}}\right)$$

is $$\left(\frac{1}{2^N}\right)$$

where N is the number of shifts. Thus each bit shift is a divide by two, so the quantity $$\left(\frac{1}{2^{shift}}\right)$$

becomes ½ for a one bit shift, ¼ for a two bit shift, etc.

Because this time constant must be varied as a function of the SOC (capacitance changes vs. SOC), temperature, and age (resistance changes with age and temperature), it is simplest to change the time between calculations, with some timer peripheral typically included with most microcontrollers, or easily built into a state machine. The time between calculations becomes:

$$t_{calc} = -\tau \ln\left(1 - \frac{1}{2^{shift}}\right)$$

Two controllable timer dividers can be cascaded to produce $t_{calc}$, one representing the resistance, and the other representing the capacitance. The two timer dividers in software or hardware would be coupled so that the output of one timer divider would be the time base for the other timer divider. By way of example, if a particular value of R causes the first timer divider to divide a reference of frequency F by M, and a particular value of C causes the second timer divider to divide the output of the first timer divider F/M by N, then the frequency of the output of the second timer divider would be F/(MN), thereby having a period of (MN)/F, or a period $t_{calc}$ proportional to the product of R times C, or proportional to $\tau$ as in the above equation.

From another perspective, the equation:

$$OCV_{n+1} = OCV_n + (V_{CELL} - OCV_n) >> \text{shift}$$

represents a change in the voltage on the cap as a function of a voltage across a resistor (i.e. a current into the cap). Any number of resistor paths can have a current summed into that cap, with different shifts and different $t_{calc}$'s, to produce a more complicated RC network. Additionally, multiple caps can be added to the simulation, with the voltage on multiple caps influencing other caps, through delta-V's across resistors. For example, a simple 2 pole system could be implemented with the following 2 equations:

$$OCV2_{n+1} = OCV2_n + (V_{CELL} - OCV2_n) >> \text{shift2}$$

$$OCV1_{n+1} = OCV1_n + (OCV2_n - OCV1_n) >> \text{shift1}$$

But a more exact implementation would also include the influence of OCV1 and OCV2 on each other, as follows $$OCV2_{n+1} = OCV2_n + (V_{CELL} - OCV2_n) >> \text{shift2} + (OCV1_n - OCV2_n) >> \text{shift2}b$$

$$OCV1_{2+1} = OCV1_n + (OCV2_n - OCV1_n) >> \text{shift1}$$

$t_{calc1}$, $t_{calc2}$, shift1, shift2, and shift2b determine the time constants of each pole and zero. Note that from the general equation;

$$t_{calc} = -\tau \ln\left(1 - \frac{1}{2^{shift}}\right)$$

the longest period between calculations $t_{calc}$ for a given time constant $\tau$ is for a single shift. Also, in voltage based fuel gauges having multiple time constants, different shifts may be associated with different time constants to more equalize the time between calculations of the entire battery model. In that regard, such a battery circuit model may be defined or approximated by equations having the open circuit voltage $OCV_{n+1}$ on each node in the battery circuit model a function of the prior open circuit voltage $OCV_n$ on that node and the prior open circuit voltage on at least one other node of the battery circuit model, or the terminal voltage of the battery circuit, or both at least one other node of the battery circuit model and the terminal voltage of the battery circuit, the equations also having a plurality of exponential terms, each in the form $e^{-t/\tau_n}$, where t is time and $\tau_n$ is one of multiple time constants 1 through n. In this case, the time between calculations for each node will be $$t_{calc} = -\tau_n \ln\left(1 - \frac{1}{2^{shift}}\right)$$

where $\tau_n$ is a time constant associated with that node, and $$\left(\frac{1}{2^{shift}}\right)$$

is equal to $$\left(\frac{1}{2^N}\right)$$

where N is the number of bit shifts used in calculating t between the adjacent nodes. This again allows a digital calculation of each $OCV_{n+1}$ from the respective $OCV_n$ and $V_{cell}$ without requiring a multiply operation or the evaluation of exponentials. Thus more elaborate models can be easily implemented digitally in this manner, with minimal requirements on digital circuitry.

Also while the present invention fuel gauges have been described as an advantageous alternative to coulomb counters, a fuel gauge in accordance with the invention may be used in addition to a coulomb counter to provide optimal short term and long term accuracy. Such combinations are described below.

Figure 15:
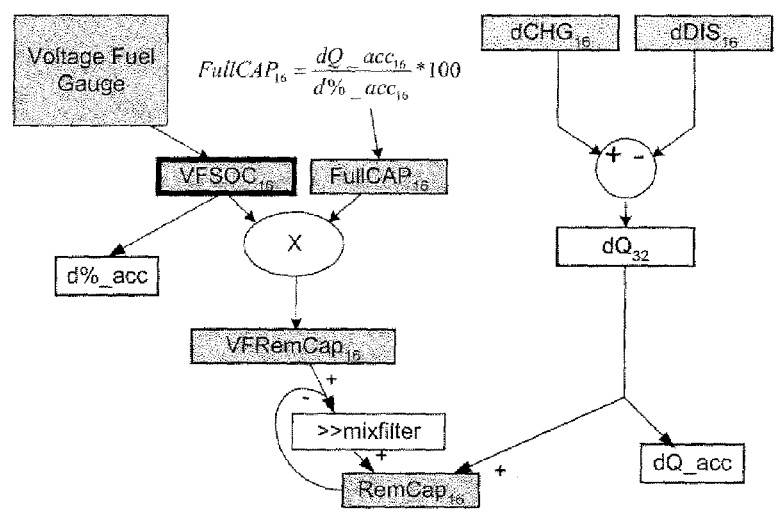
FIG. 15 shows how the output of a coulomb counter and voltage-based fuel gauge can be mixed to produce a much better accuracy than either alone will generally produce.

FIG. 15 shows how a coulomb counter (CC) and voltage-based fuel gauge (VFG or VF) can be combined to produce much better accuracy. The Coulomb-Counter provides the accumulated charge counts (dCHG) and discharge counts (dDIS), which are converted to mAh (the integral of current over time). The voltage-based fuel gauge produces a State-Of-Charge (SOC) result in %, as $VFSOC_{16}$. % SOC is accumulated d %_acc, and mAh is accumulated in dQ_acc. After d % fills to a predefined value, Full-Capacity is calculated by taking dQ_acc/d %_acc*100. Typically this result is filtered (not shown) to produce a more stable Full-Capacity. The voltage-based fuel gauge's SOC answer is converted to mAh based on Full-Capacity and becomes VFRemCap. The coulomb-counter directly exerts an influence on RemCap, the final output for remaining capacity, in mAh. The VFRemCap exerts a small and continual correcting influence on RemCap, and dominates the changes in RemCap only during low or zero currents. During high currents the coulomb-counter, which is better at high currents, dominates the changes in RemCap. And during low and zero currents, the remaining cap RemCap is naturally corrected to that indicated by the battery voltage. Also, when a coulomb-counter is used simultaneously with a voltage-based fuel-gauge, the coulomb-counter dQ can be compared to the % change in the voltage fuel-gauge state of charge (preferably useful current remaining) to determine any nonlinearity in the voltage fuel-gauge. In this way, the system can understand the error of the model used in the voltage-fuel-gauge. By understanding the mismatch between the battery and the model, the system may recognize actual changes in the battery, potentially recognizing damage or dangerous battery failures.

Traditional coulomb counters have an initial condition which is determined by the battery voltage. Furthermore, they correct their SOC by detecting full and/or empty based on the real battery voltage. So a coulomb counter cannot be any more accurate than the accuracy of this initial voltage translation. The voltage translation normally neglects the voltage's dependence on time, or the short-term memory of the battery voltage. I.e., batteries remember their treatment from up to 1 hour prior to the voltage measurement. A smarter model-based voltage-based fuel gauge considers this, and provides a better voltage to SOC translation. So the long-term corrections normally required in a coulomb-counter are replaced by small, continual corrections from a voltage-based fuel gauge, as hereinbefore described. Thus a voltage-based fuel gauge can be combined with a traditional CC (Coulomb-Counter Fuel-gauge) to provide accuracy better than either algorithm without the side effects of either algorithm, such as:

No accumulating error, normally caused by the offset of the coulomb counter.

Good coulomb counter linearity without the impact of model error in the voltage-based fuel gauge.

No relearn cycles needed, unlike a normal coulomb counter.

Never needs to hit full or empty because of stabilizing effect of the voltage-based fuel gauge.

No sudden corrections as seen in coulomb counters near empty and full conditions.

Low sensitivity to offset (because of voltage-based fuel gauge contribution) allows usage of cheaper, simpler coulomb counters.

Also a Custom-Table is typically not required for the voltage-based fuel gauge. Because of the low sensitivity to model error because of the coulomb counter contribution, and the lack of need of a relearn cycle because of voltage-based fuel gauge, a custom table is not required except perhaps for drastic chemistry changes. I.e. one table could support all Lithium batteries, excluding those with higher charge voltage or lower discharge voltage. The detailed model variations between full and empty will have a small impact on the accuracy, which normally depends on the coulomb counter.

Further, the combination of a voltage-based fuel gauge and a coulomb counter, Fast Battery sizing is achieved. In a coulomb counter and voltage-based fuel gauge system, FullCapacity can be measured in only a small fraction of a charge or discharge cycle. Since the coulomb counter returns dQ (delta-mAh), and the voltage-based fuel gauge returns d % (delta % State-of-Charge), the ratio dQ/d % results in an instantaneous estimate of the full capacity of the battery. This allows for a general purpose system which can be insensitive to battery size or current-sense resistor error. This also tracks the aging effect on FullCapacity. This also allows the battery to be sized without hitting empty or full.

The use of a coulomb counter requires a current sense resistor. Except for the resistor, however, the present invention may be practiced using one or more custom integrated circuits, or in a microprocessor or microcontroller under software control. The software may be in the form of a computer readable storage medium having stored thereon a sequence of instructions which, when executed by a computer, cause the computer to perform any of the methods or parts thereof described herein. As used herein and in the claims, the word computer is used in the general sense to refer to any machine that may operate, at least in part, under software control.

The present invention battery model fuel gauges have been described with respect to Li-Ion batteries, though the same principles may be applied to other rechargeable battery types. Further, in at least some places in this disclosure, reference has been made to removal of at least partially discharged batteries and their replacement with charged batteries. It is to be understood, however, that the present invention is readily usable in devices wherein the battery normally remains in the device during recharging. In such devices, the present invention battery model fuel gauges will also track the charge cycle as well as the discharge cycle, indicating the open terminal battery voltage during discharging or charging, independent of the load current on the battery or charge current being delivered to the battery, or both.

Thus, in accordance with the present invention, the fuel gauge circuit model transfer function chosen, as well as the computations required, may be implemented in analog circuitry, digital circuitry, a digital signal processor or simply in microprocessor software. Because of the relative simplicity of the model that may be used, very small and inexpensive implementations may be realized. Since the fuel gauges alone of the present invention only need to measure voltage, they do not need a coulomb counter or sense resistor, saving complexity, size and cost. In addition, the accuracy of the fuel gauges of the present invention tends to converge with time, unlike coulomb counters where accuracy diverges with time. The fuel gauge outputs of the present invention are a direct function of the battery's percent capacity, rather than a function of amp-hours. Therefore, unlike coulomb counters alone, battery aging affects are automatically accounted for, thereby simplifying the processing (computational) requirements. Also because the output of the fuel gauges in accordance with the present invention is a function of the battery's percent capacity, calibration of the fuel gauges is not required. The fuel gauge will automatically become accurate with time, even if the battery never reaches a fully charged or a fully discharged state. This of course, again is unlike a coulomb counter fuel gauge alone that requires a full discharge per charge cycle for calibration. Furthermore, for the present invention, when a new battery is connected to the fuel gauge, the battery's capacity can be approximated within a few seconds, after which any residual error will decrease with time.

In the description of FIG. 1 above, it was pointed out that that Figure is a graph illustrating the state of charge (SOC) versus open circuit single cell voltage (OCV) for lithium-ion batteries of various manufacturers. In this graph, the state of charge is a measure of useful energy in the battery versus open-circuit voltage. Such a measure of state of charge is particularly applicable to battery powered devices such a cameras wherein much energy is used to power a charge pump for the flash, or where the battery may power a switching regulator that powers the device. However for devices powered through a linear regulator, ampere hours may be a better measure of state of charge. Accordingly, in the claims to follow, state of charge is used in a general sense to indicate some useful measure of the battery life remaining before replacement or recharging is needed versus open-circuit voltage of the battery. Whatever conversion between open-circuit voltage and useful life remaining is used being easily made, by way of example, by look-up table.

Also, when a coulomb-counter is used simultaneously with a voltage-based fuel-gauge, the coulomb-counter dQ can be compared to the % change in the voltage fuel-gauge to determine any nonlinearity in the voltage fuel-gauge. In this way, the system can understand the error of the model used in the voltage-fuel-gauge. By understanding the mismatch between the battery and the model, the system may recognize actual changes in the battery, potentially recognizing damage or dangerous battery failures.

Thus while certain preferred embodiments and implementations of the present invention have been disclosed and described herein for purposes of illustration and not for purposes of limitation, it will be understood by those skilled in the art that various changes in form and detail may be made therein without departing from the spirit and scope of the invention.

What is claimed is:

1. A method of monitoring current delivered by a battery comprising:
providing a model of a battery circuit that includes the battery dynamic electrical characteristics;
monitoring the battery circuit terminal voltage;
estimating the open circuit voltage of the battery circuit using the battery circuit model and the battery circuit terminal voltage, including during the application of a load on the battery circuit; and,
using the battery circuit model, estimating the current being delivered by the battery circuit responsive to the estimated open circuit voltage of the battery circuit and the battery circuit terminal voltage.

2. The method of claim 1 wherein the battery circuit consists of the battery.

3. The method of claim 1 wherein excessive current in the battery circuit is detected.

4. The method of claim 1 wherein the current being delivered by the battery circuit is estimated by the difference between the estimated open circuit voltage of the battery circuit and the battery circuit voltage.

5. The method of claim 1 wherein the battery circuit model is a single pole RC model.

6. The method of claim 5 wherein the time constant of the RC model is determined by applying a constant charging voltage to the battery circuit and determining the time constant of the decay of the charging current with time.

7. The method of claim 6 wherein the value of R in the RC model is determined from the time constant using the value of C for the present state of charge of the battery circuit.

8. The method of claim 1 wherein the battery circuit model is a multiple pole RC model.

9. The method of claim 8 wherein the battery circuit has multiple time constants, and wherein the longest time constant of the RC model is determined by applying a constant charging voltage to the battery circuit and determining the longest time constant of the decay of the charging current with time.

10. The method of claim 9 wherein the value of R is determined from the longest time constant using the value of C for that time constant and for the state of charge of the battery circuit.

11. The method of claim 1 wherein:
the battery circuit model is a single pole RC model characterized by the equation $OCV_{n+1} = OCV_n \cdot e^{-t_{calc}/\tau} + V_{CELL} \cdot (1-e^{-t/\tau})$, where OCV is the open circuit voltage of the battery circuit, $t_{calc}$ is the time between calculations to update a value of open circuit voltage $OCV_n$ of the battery circuit to a new value $OCV_{n+1}$, $\tau$ is the RC time constant of the RC model and $V_{cell}$ is the terminal voltage of the battery circuit; and,
the time between calculations $$t_{calc} = -\tau \ln\left(1 - \frac{1}{2^{shift}}\right)$$

where $$\left(\frac{1}{2^{shift}}\right)$$

is equal to $$\left(\frac{1}{2^N}\right)$$

where N is the number of bit shifts used in calculating $t_{calc}$;

thereby allowing a digital calculation of $OCV_{n+1}$ from $OCV_n$ and $V_{cell}$ without using a multiply operation or the evaluation of an exponential.

12. The method of claim 11 wherein the time constant of the RC model is determined by applying a constant charging voltage to the battery circuit and determining the time constant of the decay of the charging current with time using the value of C for the present state of charge of the battery circuit to determine R of the RC model.

13. The method of claim 12 wherein the time between calculations $t_{calc}$ is set by two cascaded timers.

14. The method of claim 1 wherein:

the battery circuit model is defined or approximated by equations having the open circuit voltage $OCV_{n+1}$ on each node in the battery circuit model a function of the prior open circuit voltage $OCV_n$ on that node and the prior open circuit voltage on at least one other node of the battery circuit model, or the terminal voltage of the battery circuit, or both at least one other node of the battery circuit model and the terminal voltage of the battery circuit, the equations also having a plurality of exponential terms, each in the form $e^{-t/\tau_n}$, where t is time and $\tau_n$ is one of multiple time constants 1 through n; and, the time between calculations for each node, is $$t_{calc} = -\tau_n \ln\left(1 - \frac{1}{2^{shift}}\right)$$

where $\tau_n$ is a time constant associated with that node, and $$\left(\frac{1}{2^{shift}}\right)$$

is equal to $$\left(\frac{1}{2^N}\right)$$

where N is the number of bit shifts used in calculating $t_{calc}$ between the adjacent nodes;

thereby allowing a digital calculation of each $OCV_{n+1}$ from the respective $OCV_n$ and $V_{cell}$ without requiring a multiply operation or the evaluation of exponentials.

15. The method of claim 14 wherein the largest time constant of the battery circuit model is determined by applying a constant charging voltage to the battery circuit and determining the time constant of the decay of the charging current with time using the value of C for the present state of charge of the battery circuit.

16. The method of claim 1 further comprised of executing the method simultaneously for models of battery circuits having batteries of differing chemistries to determine which chemistry battery the method is being practiced on.

17. A method of improving performance of a battery fuel gauge comprising:

providing a voltage based fuel gauge by;
modeling a battery circuit by a battery circuit model that includes the battery dynamic electrical characteristics;
monitoring the battery circuit terminal voltage;
estimating the open circuit voltage of the battery circuit using the battery circuit model and the battery circuit terminal voltage, including during the application of a load on the battery circuit;
estimating the state of charge of the battery based on the estimated open circuit voltage of the battery circuit;
providing a coulomb counter to monitor current into and out of the battery circuit, and;
determining the remaining capacity of the battery using a combination of the state of charge determined by the voltage based fuel gauge and an output of the coulomb counter.

18. The method of claim 17 wherein the battery circuit consists of a battery.

19. The method of claim 17 wherein the battery circuit comprises the battery and a sense resistor for the coulomb counter.

20. The method of claim 17 further comprising determining the capacity of the battery by determining the ratio of a net change in amp hours as determined by the coulomb counter and a net change in the state of charge as determined by the voltage based fuel gauge.

21. The method of claim 20 further comprising repetitively mixing the remaining capacity of the battery, as determined by using a combination of the state of charge determined by the voltage based fuel gauge and an output of the coulomb counter, with a remaining capacity of the battery as determined from the state of charge and battery capacity, whereby the output of the coulomb counter will dominate the change in the remaining capacity of the battery at high battery currents and the output of the voltage based fuel gauge will dominate the change in remaining capacity of the battery at low and no battery currents.

22. The method of claim 21 further comprised of repetitively determining the battery capacity and filtering the successive results.

23. The method of claim 17 further comprising comparing the coulomb-counter dQ to the change in the voltage fuel-gauge state of charge to determine any nonlinearity in the voltage fuel-gauge, where dQ is an integral of current over time through the coulomb-counter.

24. A method of improving performance of a battery fuel gauge comprising:

providing a voltage based fuel gauge that monitors a terminal voltage of a battery to determine the battery's state of charge;
providing a coulomb counter to provide a measure of current into and out of the battery to current;
determining a first remaining charge in the battery using the product of a full capacity of the battery times the state of charge as determined by the voltage based fuel gauge;
determining a second remaining charge in the battery using a combination of the first remaining charge in the battery and the current into and out of the battery; and
repeatedly correcting the second remaining charge by continually subtracting a value responsive to the second remaining charge from the first remaining charge to continually obtain an updated second remaining charge.

25. The method of claim 24 wherein:
the coulomb counter also provides a measure of the accumulated current times time into and out of the battery, and further comprises determining a full capacity of the battery using the ratio of a difference in accumulated current into and out of the battery times time divided by the change in state of charge indicated by the voltage based fuel gauge.

26. The method of claim 25 wherein the currents into and out of the battery are converted to counts, and the measure of current times time into and out of the battery is maintained as a total count responsive to the count of the current into the battery and the count of the current out of the battery.

27. The method of claim 26 wherein the current into and out of the battery is provided by a count responsive to the current into or out of the battery.

28. The method of claim 25 wherein the method is practiced in one or more custom integrated circuits or in a microprocessor or microcontroller under software control.

29. The method of claim 24 wherein the voltage based fuel gauge uses a battery model comprising at least one resistor capacitor (RC) time constant.

30. The method of claim 29 wherein a range of state of charge of the battery is divided into multiple segments, and wherein the battery model uses a fixed resistor and a capacitor that is constant over a segment, but which varies from at least one segment to an adjacent segment.

31. A computer readable storage medium having stored thereon a sequence of instructions which, when executed by a computer, cause the computer to perform the following:
determine the battery's state of charge from the terminal voltage of a battery using a voltage based fuel gauge;
determine a first remaining charge in the battery using the product of a full capacity of the battery times the state of charge as determined by the voltage based fuel gauge;
determine a second remaining charge in the battery using a combination of the first remaining charge in the battery and the current into and out of the battery from a coulomb counter; and
continually correct the second remaining charge by continuously subtracting a value responsive to the second remaining charge from the first remaining charge to continuously obtain an updated second remaining charge.

32. The computer readable storage medium of claim 31 wherein the sequence of instructions, when executed by a computer, further cause the computer to:
provide a measure of the accumulated current times time into and out of the battery, and
determine a full capacity of the battery using the ratio of a difference in accumulated current into and out of the battery times time divided by the state of charge indicated by the voltage based fuel gauge when the voltage based fuel gauge indicates a predetermined state of charge.

33. The computer readable storage medium of claim 31 wherein the voltage based fuel gauge uses a battery model comprising at least one resistor capacitor (RC) time constant.

34. The computer readable storage medium of claim 33 wherein a range of state of charge of the battery is divided into multiple segments, and wherein the battery model uses a fixed resistor and a capacitor that is constant over a segment, but which varies from at least one segment to an adjacent segment.

* * * * *